United States Patent
Iijima et al.

(10) Patent No.: US 7,436,679 B2
(45) Date of Patent: Oct. 14, 2008

(54) RADIO-FREQUENCY MODULE FOR COMMUNICATION

(75) Inventors: Shinya Iijima, Kawasaki (JP); Tomoyuki Abe, Kawasaki (JP); Nobuyuki Hayashi, Kawasaki (JP); Yoji Ohashi, Kawasaki (JP); Toshihiro Shimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 277 days.

(21) Appl. No.: 11/188,113

(22) Filed: Jul. 25, 2005

(65) Prior Publication Data

US 2006/0202312 A1 Sep. 14, 2006

(30) Foreign Application Priority Data

Mar. 9, 2005 (JP) ............................. 2005-066027

(51) Int. Cl.
H05K 7/02 (2006.01)
H05K 7/06 (2006.01)
H05K 7/08 (2006.01)
H05K 7/10 (2006.01)

(52) U.S. Cl. ..................... 361/760; 361/764; 361/782
(58) Field of Classification Search ......... 361/760–764, 361/782–784; 385/14; 343/778–790; 257/685–692
See application file for complete search history.

(56) References Cited

U.S. PATENT DOCUMENTS

| 6,876,056 B2* | 4/2005 | Tilmans et al. | 257/528 |
| 6,879,488 B2* | 4/2005 | Takeda et al. | 361/704 |
| 6,982,480 B2* | 1/2006 | Shi | 257/687 |
| 2005/0243527 A1* | 11/2005 | Jandzio et al. | 361/760 |

FOREIGN PATENT DOCUMENTS

| JP | 08-139504 | 5/1996 |
| JP | 11-243307 | 9/1999 |
| JP | 11-243307 A | 9/1999 |
| JP | 2002-043591 | 2/2002 |
| JP | 2002-158509 | 5/2002 |
| JP | 2002-208807 A | 7/2002 |
| JP | 2004-23074 | 1/2004 |
| JP | 2004-72358 | 3/2004 |
| JP | 2004-072358 A | 3/2004 |
| JP | 2004-72358 A | 3/2004 |

OTHER PUBLICATIONS

Office Action dated Oct. 23, 2007, issued in corresponding Japanese Patent Application No. 2005-066027.
Japanese Office Action dated Oct. 23, 2007, issued in corresponding Japanese Patent Application No. 2005-066027.
Japanese Office Action dated May 7, 2008, Application No. 2005-066027.

* cited by examiner

*Primary Examiner*—Tuan T Dinh
(74) *Attorney, Agent, or Firm*—Westerman, Hattori, Daniels & Adrian, LLP.

(57) ABSTRACT

A communication radio-frequency module is provided that has a semiconductor device to which an antenna element is connected. This communication radio-frequency module includes: a supporting body that has a waveguide formed therein; a wiring board that is fixed onto a surface of the supporting body; the semiconductor device that is flip-chip mounted onto the wiring board by ultrasonic bonding; and the antenna element that is disposed on the other surface of the supporting body. In this module, the wiring board includes a board core member that is made of a resin material, and the supporting body includes a supporting body core member that is also made of a resin material.

12 Claims, 6 Drawing Sheets

RADIO-FREQUENCY MODULE FOR COMMUNICATION

CROSS-REFERENCE TO RELATED APPLICATION

This patent application is based upon and claims the benefit of priority from Japanese Patent Application No. 2005-066027, filed on Mar. 9, 2005, the entire contents of which are hereby incorporated by reference.

BACKGROUND OF THE INVENTION

The present invention generally relates to radio-frequency modules for communication, and, more particularly, to a radio-frequency module that is equipped with an antenna device and is designed for communication in microwave bands or milliwave bands, and a method of manufacturing the radio-frequency module.

In recent years, electronic apparatuses that utilize electric waves in microwave bands or milliwave bands have been increasingly produced. Particularly, electric waves in milliwave bands involving broad frequency bands that have not been used yet are suitable for high-speed, large-capacity information transmission that requires broad frequency bandwidths. Having features such as high-angle resolution and the ability to propagate in a medium that does not transmit light, such electric waves in milliwave bands are also being studied for the use in the field of sensing machines such as collision avoidance radars that are employed in vehicles or mobile robots.

Despite the high possibility of practical use, there are delays in the development and actual use of electronic apparatuses that utilize electric waves in milliwave bands, because of the high production costs of measurement instruments for millimeter electric waves and milliwave-band communication semiconductor devices that are required for the development of such electronic apparatuses.

Particularly, an MMIC (monolithic microwave IC) on which a power amplifier and a transmission/reception circuit such as an oscillator, a low-noise amplifier, and a mixer are mounted, is essential in a small-sized, light-weight milliwave-band electronic apparatus in which active elements such as a semiconductor device, passive elements such as a resistive element and a capacitor, and electric transmission lines such as microstrip lines are mounted on a single chip.

As shown in FIG. 1, in a module 100 that integrates an MMIC 101 with an antenna module 102, a hermetically sealed package 106 is often employed. In the package 106, the MMIC 101 is wire bonded or flip-chip mounted onto a ceramic substrate 104 made of alumina or the like, and a ceramic or metal cap 105 is brazed thereto. The MMIC 101 is connected to the antenna module 102 with ribbons 108 and coplanar transmission lines 109. In the antenna module 102, the MMIC 101 is connected to an antenna element 112 via waveguides 110. A transmission signal is supplied from the MMIC 101 to the antenna element 112, and is transmitted from the antenna element 112. Meanwhile, a signal received by the antenna element 112 is supplied to the MMIC 101, and signal processing or the like is performed.

However, the module 100 illustrated in FIG. 1 has the problem of high production costs. More specifically, the hermetically sealed package 106, which includes the ceramic substrate 104 and the cap 105 made of ceramics or the like, exhibits excellent reliability, but is more expensive than a resin substrate. As a result, the hermetically sealed package 106 has the problem of being not able to lower the module production costs.

Also, each of the waveguides 110 formed in the antenna module 102 is an opening that has a circular or rectangular section penetrating a ceramic board 111, and is surrounded by a conductive body. So as to form the waveguides 110 with low loss, each opening needs to be formed with high precision in terms of size. Further, as the milliwave length becomes shorter, higher accuracy is required. However, it is difficult to form a highly precise opening in the ceramic board 111, and doing so only increases the processing cost. In a case where a metal board is used instead of the ceramic board 111, the material cost for the metal board is low, but the transmission characteristics deteriorate, because a highly precise opening cannot be formed by press stamping. As a technique of forming a highly precise opening in a metal board, wire discharge processing can be performed. To do so, however, the processing cost increases, and the module production costs cannot be lowered.

SUMMARY OF THE INVENTION

A general object of the present invention is to provide communication radio-frequency modules in which the above disadvantages are eliminated.

A more specific object of the present invention is to provide a communication radio-frequency module that can be manufactured at low costs, and a method of manufacturing the communication radio-frequency module.

The above objects of the present invention are achieved by a communication radio-frequency module that has a semiconductor device to which an antenna element is connected. This module includes: a supporting body; a wiring board that is fixed onto a first surface of the supporting body; the semiconductor device that is flip-chip mounted onto the wiring board; the antenna element that is disposed on a second surface that is opposite from the first surface of the supporting body; a waveguide that penetrates the supporting body, and has an opening through the first surface and the second surface; and a waveguide converter that is disposed at a location on the surface of the wiring board on the side of the supporting body, the location being set to face the opening of the waveguide. In this communication radio-frequency module, the semiconductor device is connected to the antenna element via a vertical wiring unit that is disposed on the wiring board, the waveguide converter, and the waveguide. The wiring board includes a board core member that is made of a first resin material. The supporting body includes: a supporting body core member that is made of a second resin material; and an inorganic film that is located on the side of the first surface and has a higher coefficient of elasticity than the second resin material.

In accordance with the present invention, the supporting body core member of the supporting body is made of a resin material. Accordingly, the through hole to form the waveguide in the supporting body can be formed at a much lower cost than in a case where such a through hole is formed in a ceramic substrate or a metal substrate. As well as the supporting body core member of the supporting body, the board core member of the wiring board is made of a resin material, and can be formed at a lower cost than a conventional ceramic substrate. Accordingly, the costs for the materials can be lowered. Thus, the communication radio-frequency module can be produced at lower costs. Also, the semiconductor device and the antenna element are disposed on the opposite sides of the supporting body. With this structure, the communication radio-frequency module can be made smaller in size.

The above objects of the present invention are also achieved by a method of manufacturing a communication radio-frequency module that has a semiconductor device to which an antenna element is connected. This method includes the steps of: forming a waveguide in a supporting body that comprises a supporting body core member made of a second resin material, and an inorganic film that is formed on the side of a first surface and is made of a material with a higher coefficient of elasticity than the second resin material; fixing a wiring board onto the first surface of the supporting body, the wiring board comprising a board core member that is made of a first resin material; flip-chip mounting the semiconductor device onto the wiring board; and forming the antenna element on a second surface on the opposite side of the supporting body from the first surface.

In accordance with the present invention, the supporting body core member of the supporting body is made of a resin material. Accordingly, the through hole to form the waveguide in the supporting body can be formed at a much lower cost than in a case where such a through hole is formed in a ceramic substrate or a metal substrate. Also, the accuracy of processing the through hole can be readily increased.

In accordance with the present invention, the semiconductor device and the antenna element are disposed on the opposite sides of the supporting body, and the waveguide penetrating the supporting body is formed so as to integrate the semiconductor device and the antenna element. Also, the supporting body core member of the supporting body is made of a resin material, so as to lower the material costs and the cost for processing the through hole to form the waveguide. Thus, a low-cost communication radio-frequency module and a method of manufacturing the communication radio-frequency module can be provided.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

First Embodiment

Figure 1:
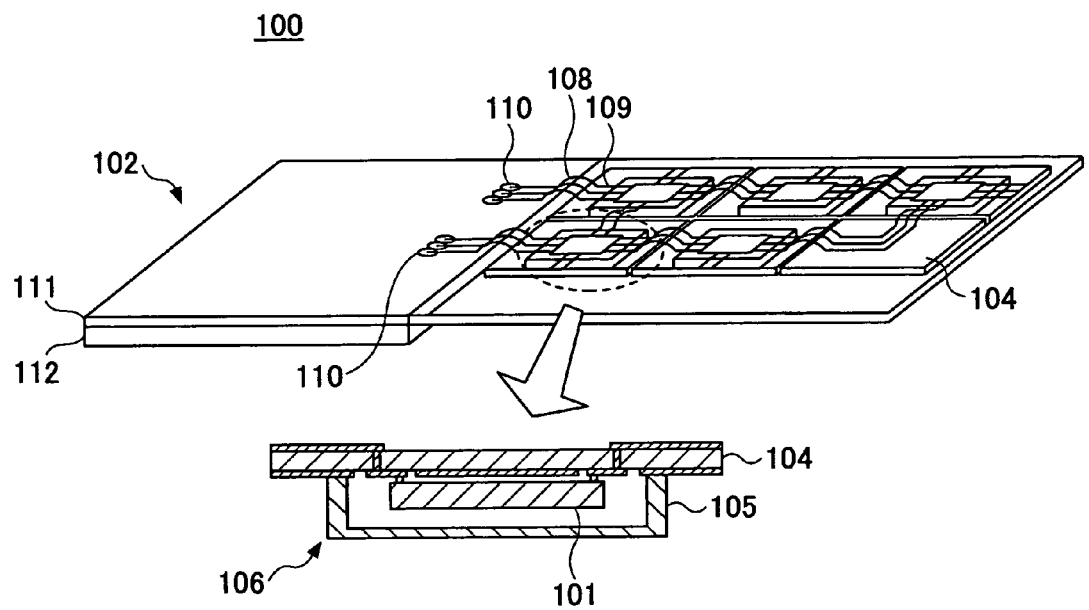
FIG. 1 illustrates a conventional module.
Figure 2:
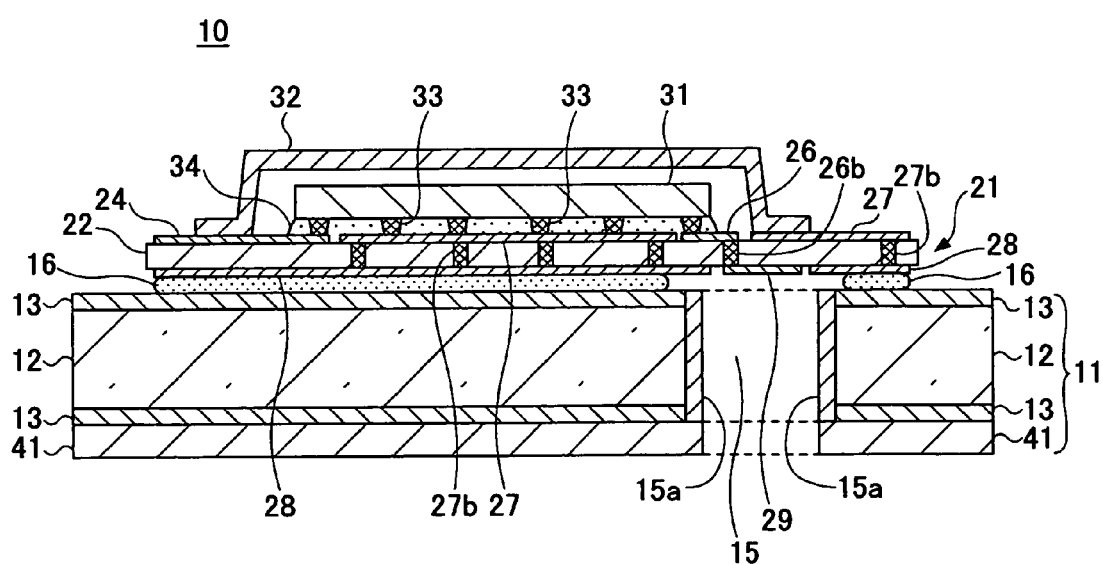
FIG. 2 is a schematic cross-sectional view of a communication radio-frequency module in accordance with a first embodiment of the present invention.

FIG. 2 is a cross-sectional view of a radio-frequency module for communication in accordance with a first embodiment of the present invention.

As shown in FIG. 2, the communication radio-frequency module 10 of this embodiment includes: a supporting body 11 in which a waveguide 15 is formed; a wiring board 21 that is fixed onto the supporting body 11; a semiconductor device 31 that is flip-chip mounted on the wiring board 21; a cap 32 that covers the semiconductor device 31; and an antenna element 41 that is fixed to the bottom surface of the supporting body 11.

The semiconductor device 31 may be formed with an MMIC (monolithic microwave IC), for example. Although not shown, the MMIC includes: a semiconductor substrate that has an active element such as an FET (field-effect transistor) and is made of GaAs or Si; a resistive element that is formed on the insulating layer on the surface of the semiconductor substrate; and a circuit pattern to which a passive element such as a capacitor is connected by wiring. The semiconductor device 31 is flip-chip mounted onto conductive patterns 24, 26, and 27 (described later in detail in conjunction with the description of FIG. 3A) in which bumps (convex electrodes) 33 as external electrodes are formed on the surface of the wiring board 21. An underfill material 34 fills the gaps between the semiconductor device 31 and the wiring board 21, thereby firmly fixing the semiconductor device 31 and the wiring board 21 to each other. The semiconductor device 31 may not have the above described circuit pattern.

The cap 32 that is made of resin or metal is provided to protect the semiconductor device 31. More specifically, the cap 32 is bonded to the upper surface of the wiring board 21 with an adhesive agent (not shown).

The wiring board 21 is formed with a board core member 22 that is a resin material, and the conductive patterns 24, 26, and 27 that are provided on the board core member 22 to establish electric connections with the semiconductor device 31 and external circuit boards. Ground electrodes 28 and a waveguide converter 29 are provided under the board core member 22. Further, through vias 26b and 27b that penetrate the substrate core member 22 and electrically connects the upper side and the lower side of the board core member 22 are provided.

Figure 3A:
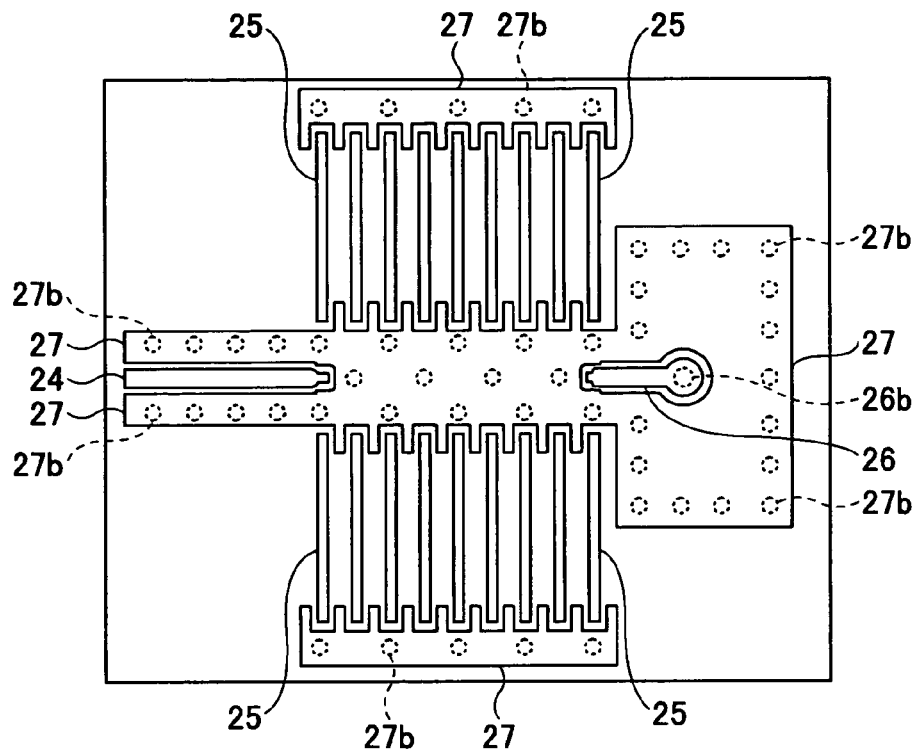
FIG. 3A is a plan view of the wiring board of FIG. 2, seen from the top.
Figure 3B:
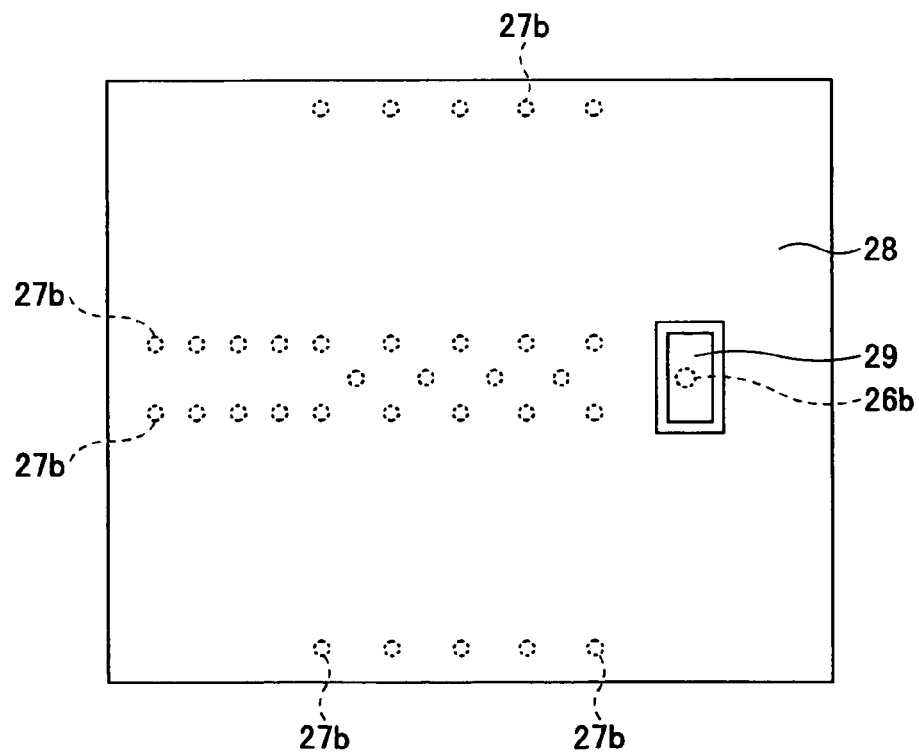
FIG. 3B is a plan view of the wiring board, seen from the bottom.

FIG. 3A is a plan view of the wiring board 21 of FIG. 2, seen from the top. FIG. 3B is a plan view of the wiring board 21 of FIG. 2, seen from the bottom.

As shown in FIGS. 3A and 3B, a signal input/output electrode 24 that performs input and output of radio-frequency signals, electrodes 25 to which DC power is supplied from the outside, a signal line pattern 26 that is connected to the waveguide converter 29 via the through via 26b, and ground electrodes 27 are disposed on the upper surface of the wiring board 21 or on the upper side of the board core member 22.

The signal input/output electrode 24 and the signal line pattern 26 are formed with coplanar transmission lines formed by the neighboring ground electrodes 27. One end of the signal input/output electrode 24 is electrically connected to the semiconductor device 31, and the other end is electrically connected to a circuit such as a voltage control oscillator (VCO) via a ribbon. One end of the signal line pattern 26 is electrically connected to the semiconductor device 31, and the other end is connected to the waveguide converter 29 via the through via 26b. The ground electrodes 27 are arranged to surround the signal input/output electrode 24 and the signal line pattern 26. The signal input/output electrode 24, the signal line pattern 26, and the ground electrodes 27 are electrically joined to the semiconductor device 31 via the bumps 33.

The waveguide converter 29 that is located to face the waveguide of the supporting body 11, and a ground electrode 28 that surrounds the waveguide converter 29 and covers almost the entire lower surface of the wiring board 21, are disposed on the lower surface of the wiring board 21 or on the lower side of the board core member 22. Here, there is a gap left between the ground electrode 28 and the waveguide converter 29.

The waveguide converter 29 may be a known converter such as a ridge waveguide converter or a slot coupling converter, but there is not a strict limitation to it. The waveguide converter 29 converts a transmission signal supplied as an electric signal from the semiconductor device via the signal line pattern 26 and the through via 26b, into a transmission wave (TE wave or TM wave). Such a transmission wave is supplied to the antenna element 41 via the waveguide 15. The waveguide converter 29 also receives a signal as a transmission wave received by the antenna element 41 via the waveguide 15. The waveguide converter 29 converts the received signal into an electric signal and supplies the electric signal to the semiconductor device 31 via the through via 26b and the signal line pattern 26.

The signal input/output electrode 24, the signal line pattern 26, the ground electrodes 27 and 28, and the waveguide converter 29 may be formed with a laminated body of Cu film, Ni film, and Au film, which are laminated in this order on the board core member 22 by a semi-additive process.

The board core member 22 of the wiring board 21 is made of a resin material. The resin material for the board core member 22 should preferably be a low dielectric constant material that exhibits low dielectric loss in microwave bands, especially milliwave bands. Examples of low dielectric constant materials include styrene butadiene resin, polyphenylene ether resin, polytetrafluoroethylene resin, bismaleimide triazine resin, maleimide styryl resin, liquid crystal polymer, cyanato ester resin, polyether ether ketone resin, polypropylene copolymer, and benzocyclobutane resin. The dielectric constant of the resin material for the board core member 22 of the wiring board 21 should preferably be low. More preferably, the relative permittivity should be 4 or lower, and be higher than 1.

The thickness of the wiring board 21 should preferably be in the range of 100 µm to 400 µm, so as to achieve excellent impedance matching in view of the wavelength of the radio frequency to be used and the relative permittivity of the wiring board 21.

Referring back to FIG. 2, the supporting body 11 includes: a supporting body core member 12 that is a plate-like resin material of approximately 3 mm in thickness; conducive films 13 that are formed on the surface of the supporting body core member 12 on the side of the wiring substrate 21 and on the surface of the supporting body core member 12 on the side of the antenna element 41; and the waveguide 15 that penetrates the supporting body 11 in its thickness direction and is located to face the waveguide converter 29 of the wiring board 21. The supporting body 11 has the upper conductive film 13 firmly bonded to the ground electrodes 28 of the wiring board 21 with a conductive adhesive agent 16. Here, the upper conductive film 13 of the supporting body 11 is also electrically connected to the ground electrodes 28 of the wiring board 21.

The supporting body core member 12 is made of a resin material that is not limited to a particular material. The supporting body core member 12 may also be made of composite materials formed by impregnating a paper base material or a glass fabric base material with a thermosetting resin such as phenol resin or epoxy resin. The supporting body core member 12 is preferable, as a glass fabric epoxy laminated substrate (FR-4) or a multilayer substrate having styrene butadiene resin impregnated has a low coefficient of thermal expansion and a high coefficient of elasticity.

The conductive films 13 are made of a highly conductive metal such as Cu, Au, Pt, Ag, Ni, or Pd, or alloy films containing those metals, or laminated films consisting of those metal films or alloy films. Alternatively, the conductive films 13 may be copper foil that is formed by electroless plating or electroplating. As the supporting body 11, a commercially available double-faced copper foil resin plate may be used. The thickness of each of the conductive films 13 is preferably in the range of 10 µm to 20 µm, and more preferably in the range of 15 µm to 20 µm. If the thickness of each conductive film 13 is smaller than 10 µm, the supporting body 11 fails to have sufficient rigidity, often resulting in trouble in ultrasonic bonding of the semiconductor device 31 to the wiring substrate 21, which will be described later. If the thickness of each conductive film 13 is greater than 20 µm, it becomes difficult to form a through hole (described later) for the waveguide 15.

The waveguide 15 is formed with a conductive film 15a provided on the wall of the rectangular or circular opening formed through the supporting body 11. In the case of a rectangular waveguide, the inside dimension of the section is determined according to the frequency of the microwave to be used. For example, in a case where the frequency to be used is 60.5 GHz to 92.0 GHz, the inner dimension is 3.10 mm by 1.55 mm. The conductive film 15a formed on the inner wall of the waveguide 15 is not limited to a particular material, but should preferably be made of a metal such as Cu, Au, Pt, or Ag, or an alloy containing one or more of those metals.

The antenna element 41 is not limited to particular kinds, but should preferably be of a microstrip type, a printed dipole type, or a slot type. With any of those types of antenna, it is easy to achieve a thin, flat, and small structure.

In the communication radio-frequency module 10, the semiconductor device 31 modulates an oscillation signal supplied from the outside with a modulation signal by the FMCW (frequency modulation continuous wave) method, thereby generating a transmission signal. The transmission signal is then supplied to the waveguide converter 29 via the signal line pattern 26 and the through via 26b of the wiring board 21. The waveguide converter 29 in turn converts the transmission signal as an electric signal into a transmission wave, and supplies the transmission wave to the antenna element 41 via the waveguide 15. A transmission signal is then transmitted from the antenna element 41.

Also, in the communication radio-frequency module 10, a signal received by the antenna element 41 is supplied to the waveguide converter 29 via the waveguide 15. The waveguide converter 29 converts the received signal as a transmission wave into an electric signal, and supplies the received signal to the semiconductor device 31 via the through via 26a and the signal line pattern 26. The semiconductor device 31 then performs signal processing on the received signal.

The communication radio-frequency module 10 may be a transmission-only or reception-only module, or may be a combination of a transmission high-frequency module and a communication high-frequency module.

Since the supporting body core member 12 of the supporting body 11 is made of a resin material in this embodiment, the through hole to form the waveguide 15 in the supporting body 11 can be processed at greatly lower costs than in a case where such a through hole is formed in a ceramic substrate or a metal substrate. As well as the supporting body core member 12 of the supporting body 11, the board core member 22 of the wiring board 21 is made of a resin material at a lower cost than in the case of a conventional ceramic substrate. Thus, the production costs of the communication radio-frequency module 10 can be lowered.

Also, in this embodiment, the semiconductor device 31 is disposed on one side of the supporting body 11 via the wiring board 21, while the antenna element 41 is disposed on the other side of the supporting body 11. Accordingly, the communication radio-frequency module 10 can be made smaller in size. Also, as the supporting body core member 12 and the board core member 22 are made of resin materials, it is possible to make the module 10 lighter than in the case of using ceramic materials or metal materials.

Next, the method of manufacturing a communication radio-frequency module in accordance with this embodiment is described.

FIGS. 4A through 4D and FIGS. 5A through 5C illustrate the procedures for manufacturing the communication radio-frequency module in accordance with the first embodiment.

Figure 4A:
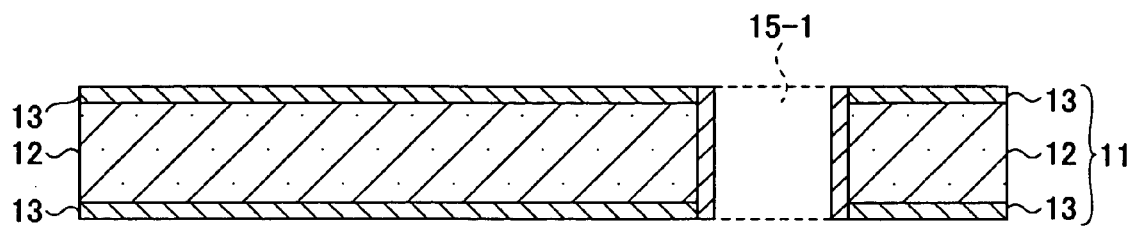
FIGS. 4A through 4D illustrate the procedures for manufacturing the communication radio-frequency module in accordance with the first embodiment.

In the procedure shown in FIG. 4A, the supporting body 11 that is a double-faced copper foil substrate (the thickness of the copper foil 13 being 18 μm, for example) is prepared. The supporting body 11 has the supporting body core member 12 made of FR-4, for example. In the supporting body 11, a rectangular through hole 15-1 (3.10 mm by 1.55 mm in size, for example) is then formed at the location to form a waveguide in the next procedure. The formation of the through hole 15-1 is carried out by drilling. The drilling is performed using a numerically controlled driller, for example. The through hole 15-1 may be formed by laser processing, instead. As the supporting body core member 12 is made of a resin material, it is easy to process. Also, as the conductive film 13 is relatively thin, a through hole can be formed with high precision by any of the above process. Further, the hole processing cost can be greatly lowered, compared with the case of forming a through hole in a metal plate or a ceramic plate with the same precision.

The supporting body 11 may also be formed in the following manner. The above described resin materials or composite materials are used for the supporting body core member 12, and a seed layer is formed on either surface of the supporting body core member 12 by sputtering or electroless plating. The conductive film 13 is then formed on the plating seed layer by electroplating.

Figure 4B:
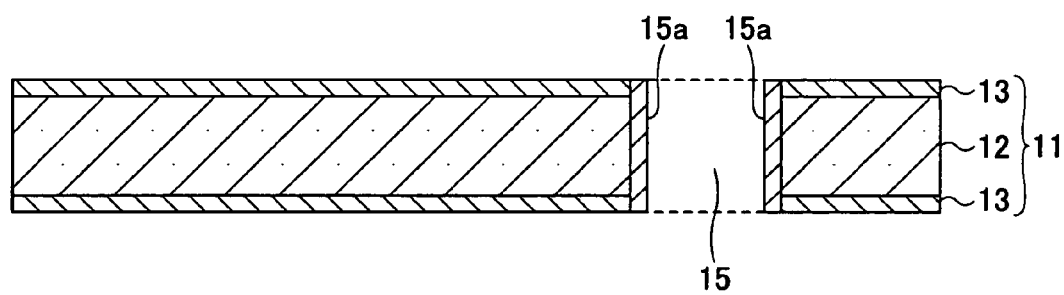

In the procedure shown in FIG. 4B, the conductive film 15a is deposited on the inner wall of the through hole 15-1 formed in the procedure shown in FIG. 4A, thereby forming the waveguide 15. More specifically, a plating seed layer of Cu film (not shown, because of its small thickness) is formed on the inner wall of the through hole 15-1 by sputtering, vapor deposition, or electroless plating. The conductive film 15a (of 15 μm in thickness, for example) is further formed by electroplating. Before the conductive film 15a is formed, a conductive film may be formed on the surface of the conductive film 13 of the supporting body 11, or the conductive film 13 may be covered with a resist film or the like to prevent the conductive film 15 from forming on the conductive film 13.

Figure 4C:
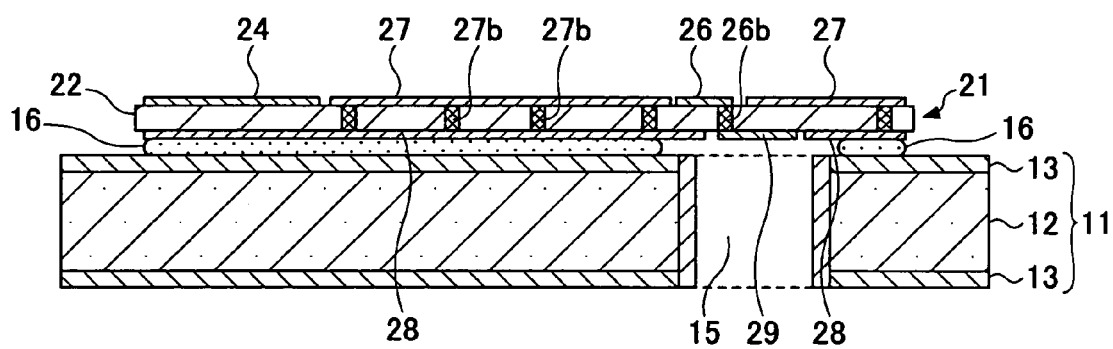

In the procedure shown in FIG. 4C, the conductive adhesive agent 16 such as silver paste is applied to the conductive film 13 on the upper surface of the supporting body 11. The wiring board 21, which is separately prepared, is then aligned with the supporting body 11, and the wiring board 21 and the supporting body 11 are bonded to each other with the conductive adhesive agent 16. The positioning is performed so that the waveguide converter 29 formed under the wiring board 21 is aligned with the waveguide 15 of the supporting body 11. The conductive adhesive agent 16 is applied to the surfaces of the ground electrodes 28 of the wiring board 21, or to the locations on the supporting body 11 corresponding to the ground electrodes 28. The bonding is then performed so that the ground electrodes 28 of the wiring board 21 become conductive with the conductive film 13 of the supporting body 11.

The formation of the wiring board 21 is now described. In the wiring board 21, through holes are formed in the board core member 22, which is made of the above described resin material, by drilling or laser processing. A conductive plating seed layer is then formed on the inner wall of each of the through holes by electroless plating. The through holes are then filled with a conductive material by electroplating, so as to form the through vias 26b and 27b. Here, a conductive film is also formed to cover either surface of the board core member 22. A photoresist film is then applied to the surface of the conductive film, or a dry-film photoresist is bonded to the surface of the conductive film. An exposing process and a developing process are then carried out using a mask, so as to form a conductive pattern 23 on the upper surface of the wiring board 21, and the patterns of the ground electrodes 28 and the waveguide converter 29 on the lower surface of the wiring board 21.

The wiring board 21 may also be formed in the following manner. Using a double-faced copper foil substrate that has copper foil formed on the board core member 22, which is made of the above described resin material, the through holes are formed, and the through vias 26b and 27b are formed by filling the through holes with a conductive material by performing electroless plating and electroplating, as described above. Also as described above, the conductive pattern 23, the ground electrodes 28, and the waveguide converter 29 are formed in this order by patterning copper foil. The filling of the through holes with the conductive material is performed by filling the through holes with conductive paste by a printing technique, and then curing the conductive paste.

Figure 4D:
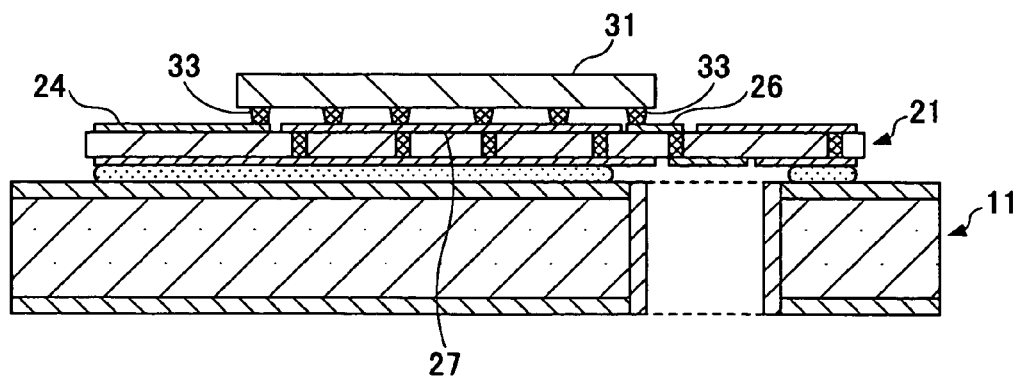

In the procedure shown in FIG. 4D, the semiconductor device 31 is flip-chip mounted onto the wiring board 21. The method of joining the bumps 33 of the semiconductor device 31 to the signal input/output electrode 24, the signal line pattern 26, and the ground electrodes 27 is not particularly limited. However, it is preferable to perform ultrasonic bonding, which does not soften the wiring board 21 with heat or the like.

Figure 6:
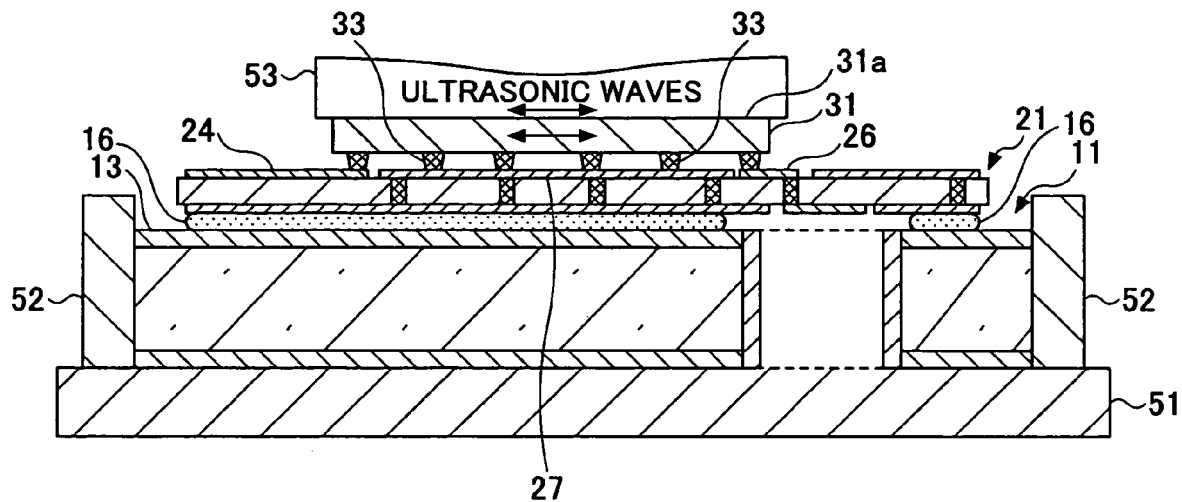
FIG. 6 illustrates the procedure for ultrasonically bonding the semiconductor device shown in FIG. 4D.

FIG. 6 illustrates the procedure for ultrasonically bonding the semiconductor device 31 to the wiring board 21. As shown in FIG. 6, the supporting body 11 is placed on a bonding stage 51, and is then fixed by a vacuum suction chuck mechanism or the like. To secure the fixing of the supporting body 11, the outer periphery of the supporting body 11 is fixed with clamping jigs 52. Meanwhile, the semiconductor device 31 to be mounted is aligned with the bumps 33 and the wiring board 21, with its surface 31a being fixed by a bonding tool 53. After the positioning is completed, the bumps 33 of the semiconductor device 31 are pressed against the signal input/output electrode 24, the signal line pattern 26, and the ground electrodes 27 of the wiring board 21. In this state, ultrasonic vibration is applied to the semiconductor device 31 through the bonding tool 53.

At this stage, the wiring board 21 is fixed to the conductive film 13 of the supporting body 11 with the conductive adhesive agent 16. As the coefficient of elasticity of the conductive film 13 is large, distortion due to the application of ultrasonic wave is not easily caused in the conductive film 13. Accordingly, the conductive film 13 functions to fix the wiring board 21 with the conductive adhesive agent 16. In this structure, distortion is not easily caused in the wiring board 21, either, and only the bumps 33 ultrasonically vibrate. Here, heat is efficiently generated through friction, and the generated heat melts the surfaces of the bumps 33, the surface of the signal input/output electrode 24, the surface of the signal line pattern 26, and the surfaces of the ground electrodes 27. Accordingly, the bumps 33 are certainly bonded to the signal input/output electrode 24, the signal line pattern 26, and the ground electrodes 27, after the application of ultrasonic vibration. Thus, highly reliable bonding is performed through ultrasonic bonding.

Figure 5A:
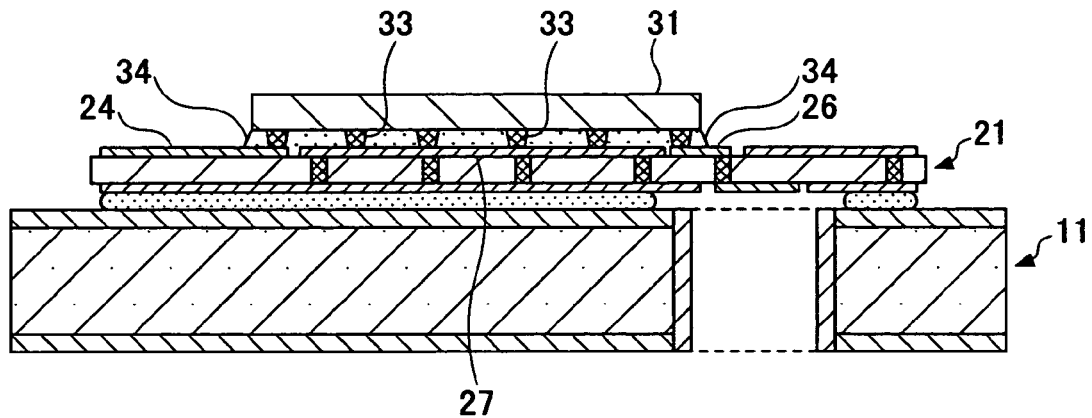
FIG. 5A through 5C illustrate the procedures for manufacturing the communication radio-frequency module in accordance with the first embodiment.

In the procedure shown in FIG. 5A, the gaps between the semiconductor device 31 and the wiring board 21 are filled with the underfill material 34. The underfill material 34 is preferable, because, with the underfill material 34, the filling can be performed after the bonding of the bumps 33 of the semiconductor device 31, which is a so-called post filling method. By the post filling method, trouble is not caused, because the resin material or fillers contained in the underfill material 34 are not interposed between the bumps 33 and the signal input/output electrode 24, the signal line pattern 26, and the ground electrodes 27. However, if such trouble can be avoided by suitably selecting the material for the underfill material 34, the filling may be performed with the underfill material 34 prior to the bonding of the semiconductor device 31.

Figure 5B:
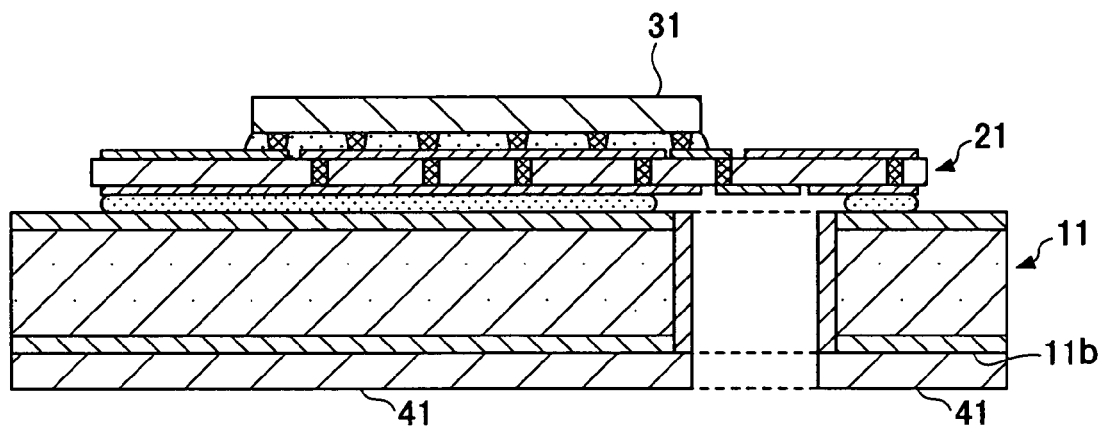

In the procedure shown in FIG. 5B, the antenna element 41 is aligned with the waveguide converter 29 on the lower surface 11b (the opposite surface from the wiring board 21) of the supporting body 11, and is secured by bonding or the like.

Figure 5C:
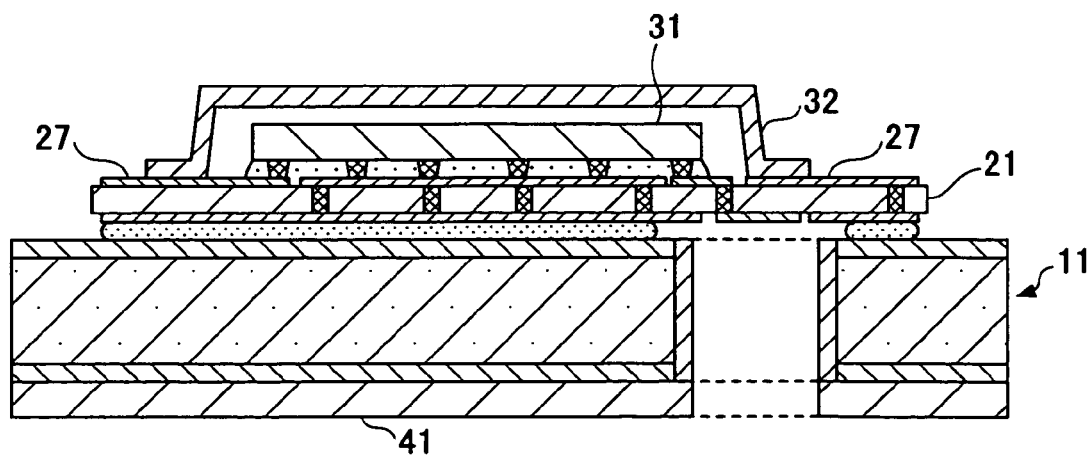

In the procedure shown in FIG. 5C, the cap 32 that is made of metal or a resin material is fixed to the wiring board 21 with an adhesive agent, so as to cover the semiconductor device 31. Through the above procedures, the communication radio-frequency module 10 shown in FIG. 2 is produced.

By the manufacturing method in accordance with this embodiment, the through hole 15-1 of the waveguide 15 is formed by a low-cost hole forming process, and the production costs can be lowered accordingly. Also, the supporting body core member 12 of the supporting body 11 in which the waveguide 15 is formed is made of a resin material. Accordingly, highly accurate hole making can be readily performed.

By the manufacturing method in accordance with this embodiment, the supporting body core member 12 of the supporting body 11 is made of a resin material. Accordingly, the through hole 15-1 to form the waveguide 15 in the supporting body 11 can be formed at a greatly lower cost than in the case of forming such a through hole in a ceramic substrate or a metal substrate. Also, the accuracy of processing the through hole 15-1 can be readily increased.

Also, the conductive film 13 with high elasticity is provided on the surfaces of the supporting body 11, and ultrasonic wave is applied so as to protect the wiring board 21 from distortion at the time of ultrasonic bonding. Accordingly, highly reliable bonding can be performed on the semiconductor device 31 and the wiring board 21 through ultrasonic bonding. As a result, the distance between the semiconductor device 31 and the antenna element 41 can be shortened, and transmission and reception signal loss can be reduced. Also, the signal transmission from the transmission path can be restricted, and the signal-to-noise ratio can be increased.

Second Embodiment

Figure 7:
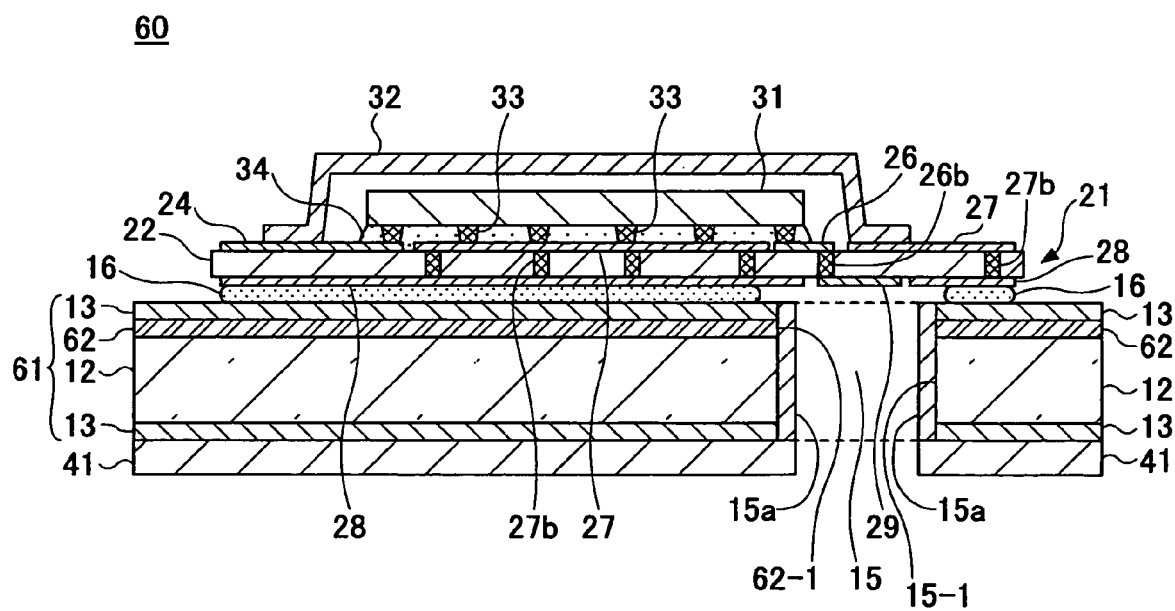
FIG. 7 is a schematic cross-sectional view of a communication radio-frequency module in accordance with a second embodiment of the present invention.

FIG. 7 is a schematic cross-sectional view of a communication radio-frequency module in accordance with a second embodiment of the present invention. In this drawing, the same components as those of the first embodiment are denoted by the same reference numerals as those in the first embodiment, and explanation of them is omitted in the following description.

As shown in FIG. 7, the communication radio-frequency module 60 is the same as the communication radio-frequency module 10 in accordance with the first embodiment, except that a ceramic film 62 is interposed between the supporting body core member 12 and the conductive film 13 on the upper surface side of a supporting body 61 (on the side of the wiring board 21).

The ceramic film 62 may be made of alumina, crystallize glass, aluminum nitride of 500 μm in thickness, or a mixed material of those materials, for example. The ceramic film 62 is fixed to the supporting body core member 12 with an adhesive agent. The formation of the ceramic film 62 is not particularly limited. For example, a sheet (a so-called "green sheet") made of a mixture of ceramic particles dispersed in a flux, a resin, a plasticizer, and the like, may be formed in an opening 62-1, and resin removal or baking is performed to form the ceramic film 62.

Instead of the ceramic film 62, a thin-plate (500 μm in thickness, for example) semiconductor substrate may be employed. In such a case, the opening 62-1 is formed by performing selective wet-etching on the semiconductor substrate.

In this embodiment, the communication radio-frequency module 60 has the same effects as the communication radio-frequency module 10 in accordance with the first embodiment. The communication radio-frequency module 60 has the ceramic film 62 interposed between the supporting body core member 12 and the conductive film 13. With this arrangement, the wiring board 21 is more firmly protected from distortion when the semiconductor device 31 is ultrasonically bonded to the wiring board 21. Thus, the semiconductor device 31 and the wiring board 21 can be bonded to each other with higher reliability.

Third Embodiment

Figure 8A:
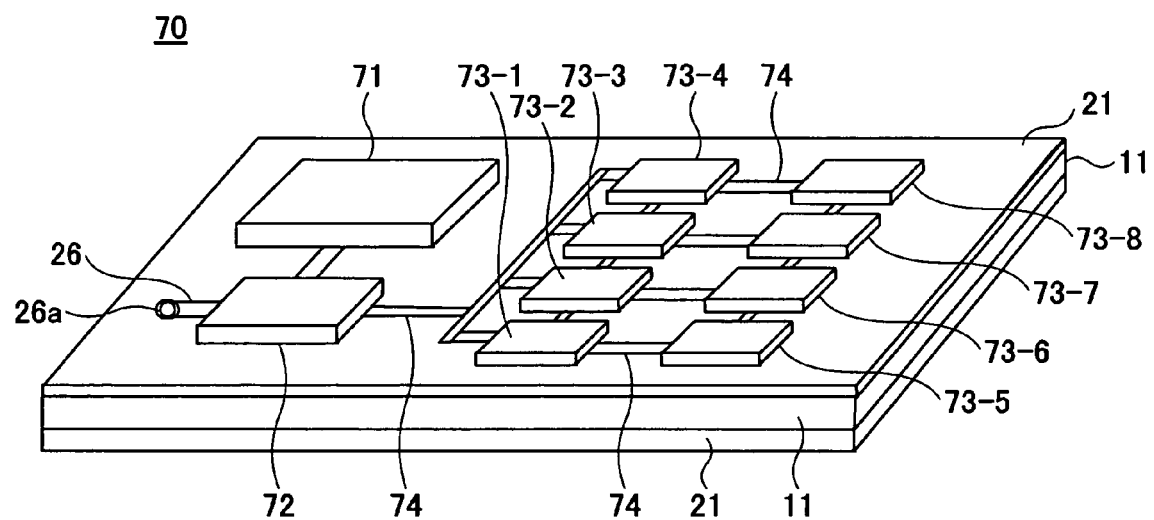
FIG. 8A is a schematic perspective view of a communication radio-frequency module in accordance with a third embodiment of the present invention.
Figure 8B:
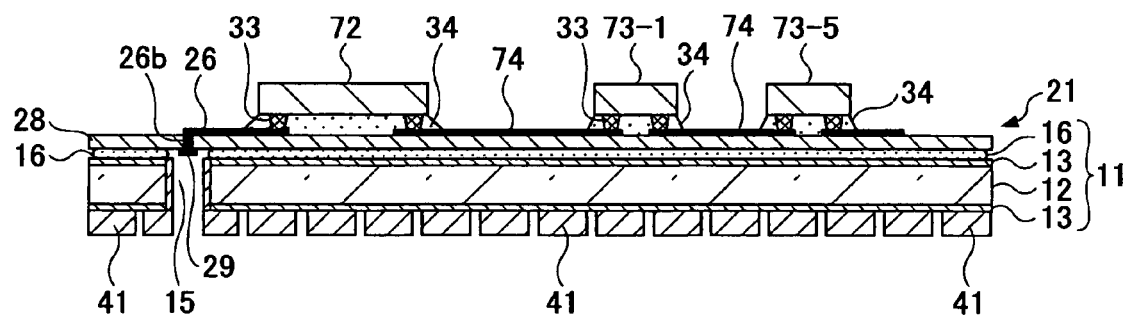
FIG. 8B is a cross-sectional view of the communication radio-frequency module of FIG. 8A.

FIG. 8A is a schematic perspective view of a communication radio-frequency module in accordance with a third embodiment of the present invention. FIG. 8B is a cross-sectional view of the communication radio-frequency module. In FIGS. 8A and 8B, the components equivalent to the above described components are denoted by the same reference numerals as those denoting the foregoing components, and explanation of them is omitted in the following description.

As shown in FIGS. 8A and 8B, the communication radio-frequency module 70 of this embodiment includes a semiconductor device 71 to which a voltage controlled oscillator (VCO) is mounted, a transmission semiconductor device 72, reception semiconductor devices 73-1 through 73-8, and antenna elements 41 that are connected to the transmission semiconductor device 72 and the reception semiconductor devices 73-1 through 73-8. The semiconductor devices 71, 72, and 73-1 through 73-8 are connected to one another with coplanar transmission lines 74. The transmission semiconductor device 72 is connected to one of the antenna elements 41 and the waveguide converter 29 via the signal line pattern 26 and the through via 26b. The waveguide converter 29 is connected to the corresponding antenna element 41 via the waveguide 15 that penetrates the supporting body 11. The reception semiconductor devices 73-1 through 73-8 are connected to the corresponding antenna elements 41 that are arranged at a distance from one another. In FIGS. 8A and 8B, the through vias 27b for grounding, and the transmission lines between the reception semiconductor devices 73-1 through 73-8 and the reception antenna elements 41, are not shown.

The communication radio-frequency module 70 may be used as vehicle radar device that is mounted on a vehicle and detects driving directions and the distance from another vehicle or an obstacle. In the communication radio-frequency module 70, the transmission semiconductor device 72 converts and amplifies a modulation signal transmitted from the semiconductor device 71 having a VCO into a transmission signal. The transmission signal is transmitted as a millimeter transmission wave (76 GHz, for example) from the antenna element 41 via the signal line pattern 26 and the waveguide 15. Meanwhile, waves reflected by another vehicle or an obstacle are received by the reception antenna elements 41, and signal processing is performed by the reception semiconductor devices 73-1 through 73-8. Using the phase differences among the reflected waves received by the reception semiconductor devices 73-1 through 73-8, the bearing of another vehicle or the like is detected, and the distance from the vehicle of the like is determined from the time required between the transmission and reception of the reflected waves. Also, the differences in frequency between transmission waves and the reflected waves (due to the Doppler Effect) are detected to determine the relative velocity with respect to another vehicle or the like. In the communication radio-frequency module 70, the eight reception semiconductor devices 73-1 through 73-8 detect reflected waves independently of one another or in cooperation with one another, so that other vehicles and obstacles can be simultaneously detected.

Like the communication radio-frequency module 10 in accordance with the first embodiment illustrated in FIG. 2, the communication radio-frequency module 70 has the semiconductor devices 71, 72, and 73-1 through 73-8 flip-chip mounted on the wiring board 21 fixed onto the supporting body 11, and the supporting body core member 12 of the supporting body 11 and the board core member 28 of the wiring board 21 are made of resin materials.

Accordingly, the communication radio-frequency module 70 in accordance with the third embodiment has the same effects as the first embodiment. As the size of the communication radio-frequency module 70 becomes large, or the number of waveguides 15, the transmission semiconductor devices 72, and the reception semiconductor devices 73-1 through 73-8 becomes greater, the effect of lowering the cost becomes more prominent. Furthermore, since the supporting body core member 12 of the supporting body 11 and the board core member 28 of the wiring board 21 are made of resin materials, the weight and size can be reduced.

Although the cap to cover the semiconductor devices 71, 72, and 73-1 through 73-8 is not shown in FIGS. 8A and 8B, the gap 32 shown in FIG. 2 may be provided to cover the semiconductor devices 71, 72, and 73-1 through 73-8. Alternatively, a cap may be provided for each of the transmission semiconductor devices 71 and 72, and each of the reception semiconductor devices 73-1 through 73-8.

It should be noted that the present invention is not limited to the embodiments specifically disclosed above, but other variations and modifications may be made without departing from the scope of the present invention.

What is claimed is:

1. A communication radio-frequency module that has a semiconductor device to which an antenna element is connected, comprising:

a supporting body;

a wiring board that is fixed onto a first surface of the supporting body;

the semiconductor device that is flip-chip mounted onto the wiring board;

the antenna element that is disposed on a second surface that is opposite from the first surface of the supporting body;

a waveguide that penetrates the supporting body, and has an opening through the first surface and the second surface; and a waveguide converter that is disposed at a location on the surface of the wiring board on the side of the supporting body, the location being set to face the opening of the waveguide, the semiconductor device being connected to the antenna element via a vertical wiring unit that is disposed on the wiring board, the waveguide converter, and the waveguide, the wiring board comprising a board core member that is made of a first resin material, the supporting body comprising:

a supporting body core member that is made of a second resin material; and an inorganic film that is located on the side of the first surface and has a higher coefficient of elasticity than the second resin material.

2. The communication radio-frequency module as claimed in claim 1, wherein the inorganic film is a conductive film.

3. The communication radio-frequency module as claimed in claim 1, wherein the supporting body core member is either a glass fabric epoxy laminated substrate or a multilayer substrate that is impregnated with styrene butadiene resin.

4. The communication radio-frequency module as claimed in claim 1, wherein the second resin material is one of a resin material, a composite material that is formed by impregnating a glass fabric base material with a resin material, and a group of composite materials that are formed by impregnating glass fabric base materials with resin materials.

5. The communication radio-frequency module as claimed in claim 1, wherein the first resin material has a relative permittivity of 4 or lower.

6. The communication radio-frequency module as claimed in claim 1, wherein the waveguide is a hallow waveguide.

7. The communication radio-frequency module as claimed in claim 2, wherein the conductive film is further formed on the second surface.

8. A communication radio-frequency module that has a semiconductor device to which an antenna element is connected, comprising:

a supporting body;

a wiring board that is fixed onto a first surface of the supporting body;

the semiconductor device that is flip-chip mounted onto the wiring board;

the antenna element that is disposed on a second surface that is opposite from the first surface of the supporting body;

a waveguide that penetrates the supporting body, and has an opening through the first surface and the second surface; and a waveguide converter that is disposed at a location on the surface of the wiring board on the side of the supporting body, the location being set to face the opening of the waveguide, the semiconductor device being connected to the antenna element via a vertical wiring unit that is disposed on the wiring board, the waveguide converter, and the waveguide, the wiring board comprising a board core member that is made of a first resin material, the supporting body comprising:

a supporting body core member that is made of a second resin material; and a metal film that is formed on the side of the first surface.

9. The communication radio-frequency module as claimed in claim 8, wherein the metal film is further disposed on the second surface.

10. The communication radio-frequency module as claimed in claim 8, wherein the supporting body has an inorganic film that is interposed between the supporting body core member and the metal film, and is made of a material with a higher coefficient of elasticity than the second resin material.

11. A communication radio-frequency module that has a plurality of antenna elements, and a transmission semiconductor device and a plurality of reception semiconductor devices that are connected to the antenna elements, the communication radio-frequency module comprising:

a supporting body;

a wiring board that is fixed onto a first surface of the supporting body;

a semiconductor device that is flip-chip mounted onto the wiring board;

the plurality of antenna elements that are disposed on a second surface that is opposite from the first surface of the supporting body, the antenna elements being arranged at a distance from one another;

a waveguide that penetrates the supporting body, and has an opening through the first surface and the second surface; and a waveguide converter that is disposed at a location on the surface of the wiring board on the side of the supporting body, the location being set to face the opening of the waveguide, the transmission semiconductor device being connected to the corresponding one of the antenna elements via a vertical wiring unit that is disposed on the wiring board, the waveguide converter, and the waveguide, the wiring board comprising a board core member that is made of a first resin material, the supporting body comprising:

a supporting body core member that is made of a second resin material; and a metal film that is formed on the side of the first surface.

12. The communication radio-frequency module as claimed in claim 11, wherein:

the transmission semiconductor device supplies a transmission signal to the corresponding one of the antenna elements, from which a transmission wave is radiated;

the transmission wave irradiates an object to be measured that is located at a distance from the communication radio-frequency module, the plurality of antenna elements receiving the transmission wave reflected; and the plurality of reception semiconductor devices measure the distance, orientation, and relative velocity between the communication radio-frequency module and the object to be measured, based on the received reflected wave.

* * * * *